(12) United States Patent
Chang et al.

(10) Patent No.: US 11,081,365 B2
(45) Date of Patent: Aug. 3, 2021

(54) TREATMENT TO INTERFACE BETWEEN METAL FILM AND BARC OR PHOTORESIST

(71) Applicant: TAIWAN SEMICONDUCTOR MANUFACTURING CO., LTD., Hsinchu (TW)

(72) Inventors: Chung-Hao Chang, Hsinchu (TW); Chih-Jen Yu, Hsinchu (TW); Keh-Wen Chang, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 244 days.

(21) Appl. No.: 16/426,457

(22) Filed: May 30, 2019

(65) Prior Publication Data
US 2020/0020546 A1    Jan. 16, 2020

Related U.S. Application Data

(60) Provisional application No. 62/698,718, filed on Jul. 16, 2018.

(51) Int. Cl.
| | | |
|---|---|---|
| *H01L 21/3213* | (2006.01) | |
| *H01L 21/311* | (2006.01) | |
| *H01L 29/423* | (2006.01) | |
| *H01L 21/8234* | (2006.01) | |
| *H01L 21/321* | (2006.01) | |

(52) U.S. Cl.
CPC .. *H01L 21/32139* (2013.01); *H01L 21/31144* (2013.01); *H01L 21/321* (2013.01); *H01L 21/823431* (2013.01); *H01L 21/823437* (2013.01); *H01L 29/42392* (2013.01); *H01L 2221/1073* (2013.01)

(58) Field of Classification Search
CPC ......... H01L 21/32139; H01L 21/31144; H01L 29/42392; H01L 21/823437; H01L 21/823431; H01L 21/321; H01L 29/66772; H01L 29/66742; H01L 29/78654; H01L 29/78684; H01L 29/78696; H01L 2221/1073
See application file for complete search history.

(56) References Cited

U.S. PATENT DOCUMENTS

| | | | | |
|---|---|---|---|---|
| 5,963,841 A * | 10/1999 | Karlsson | ........... | H01L 21/32139 134/1.3 |
| 6,063,547 A * | 5/2000 | Ye | ........... | G03F 7/091 216/41 |
| 6,107,172 A * | 8/2000 | Yang | ........... | H01L 21/32139 257/E21.314 |
| 6,130,146 A * | 10/2000 | Chang | ........... | C23C 16/308 438/592 |
| 6,645,818 B1 * | 11/2003 | Sing | ........... | H01L 21/823828 257/E21.635 |
| 2001/0051386 A1 * | 12/2001 | De Laat | ........... | H01L 21/31116 438/48 |
| 2002/0102780 A1 * | 8/2002 | Taniguchi | ........... | H01L 27/0922 438/199 |

* cited by examiner

*Primary Examiner* — Ermias T Woldegeorgis
(74) *Attorney, Agent, or Firm* — McDermott Will & Emery LLP

(57) ABSTRACT

A method of manufacturing a semiconductor device is disclosed. In the method, a metallic layer is formed over a substrate, the metallic layer is surface-treated with an alkaline solution, and a bottom anti-reflective coating (BARC) layer is formed on the surface-treated metallic layer.

20 Claims, 14 Drawing Sheets

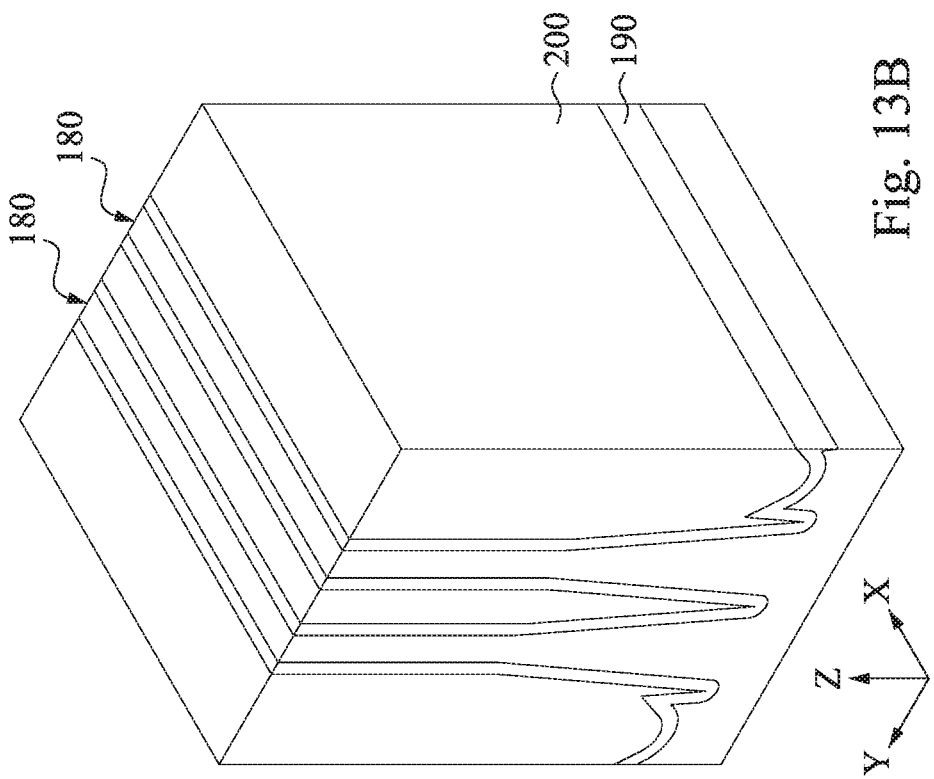
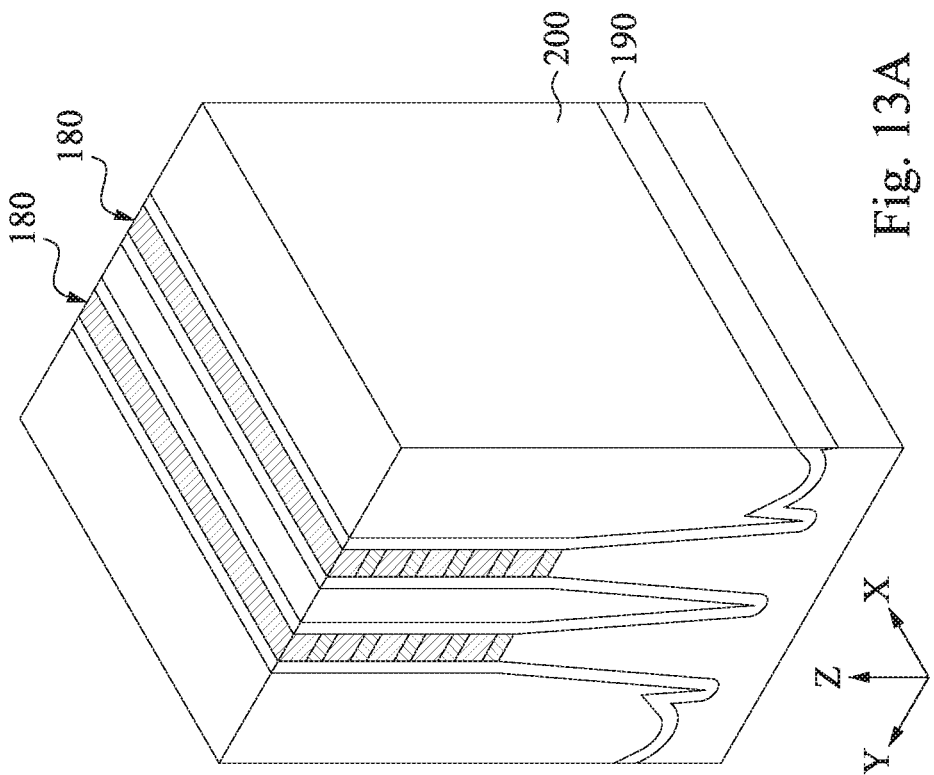
Fig. 13A
Fig. 13B

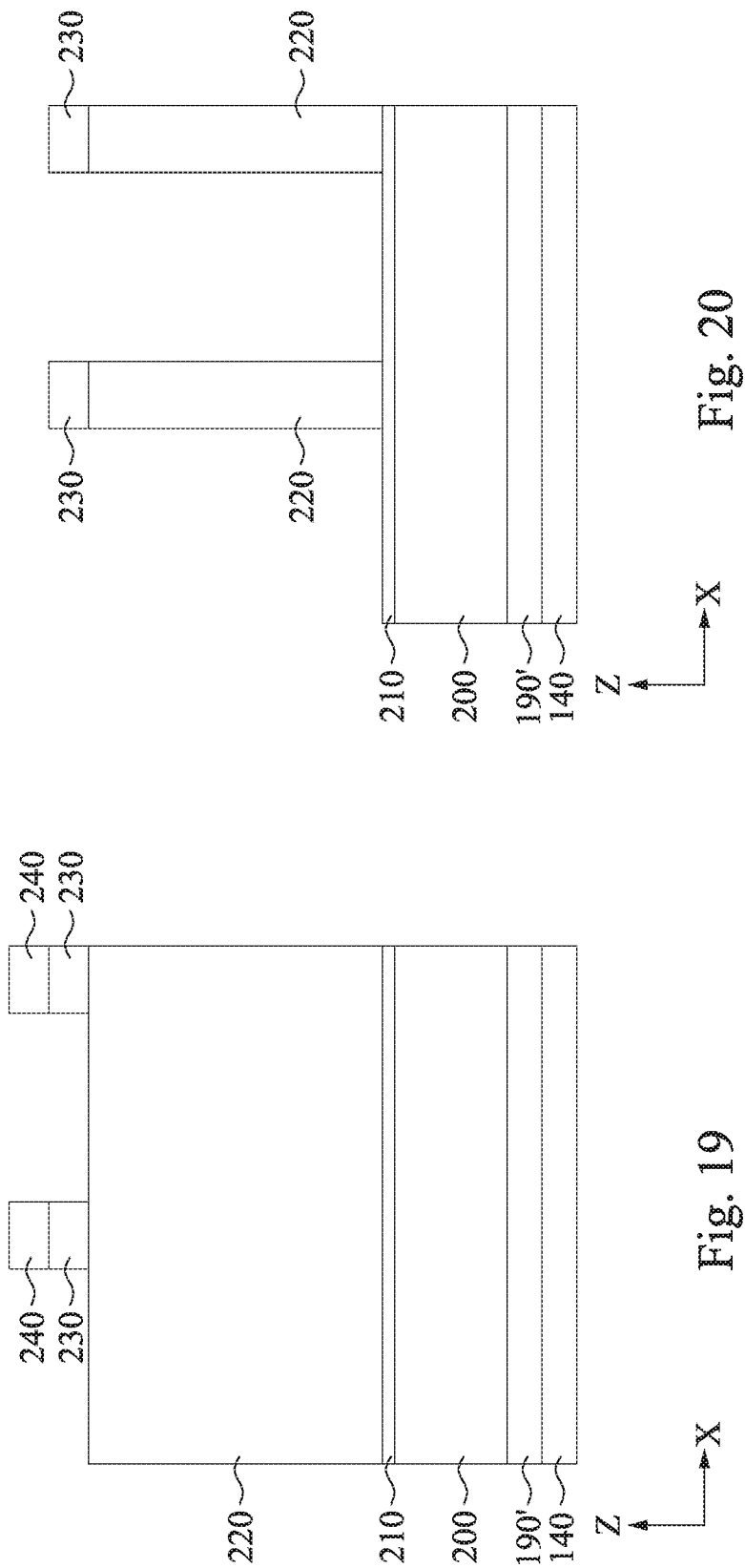

TREATMENT TO INTERFACE BETWEEN METAL FILM AND BARC OR PHOTORESIST

RELATED CASE

The present application claims the priority of U.S. Provisional Application No. 62/698,718 filed on Jul. 16, 2018, the entire contents of which are incorporated herein by reference.

BACKGROUND

In patterning operations by lithography, reflection from an underlying layer on which a photo resist layer is formed often causes pattern degradation and/or variation of critical dimensions. To suppress the reflection, a bottom anti-reflection coating (BARC) or an anti-reflective layer has been widely used.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10, 11, 12A, 12B, 13A, 13B, 14A, 14B, 15A, 15B, 16A, 16B, 17, 18, 19, 20, 21A, 21B, and 22 show sequential views of a method of manufacturing a semiconductor device, according to some embodiments of the present disclosure.

DETAILED DESCRIPTION

Figure 1:
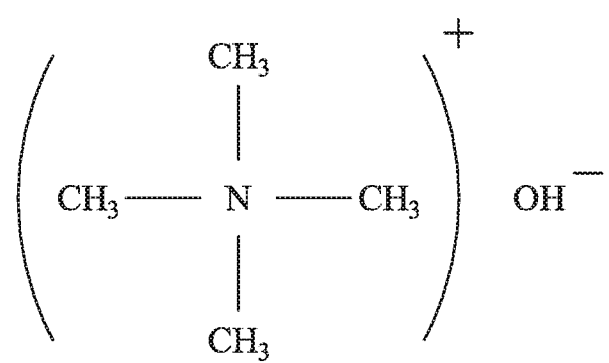
FIG. 1 shows the chemical formula of tetramethylammonium hydroxide TMAH, i.e. $[(CH_3)_4N]^+OH^-$.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In thin film manufacturing using a photolithography method, a layer of BARC (bottom anti-reflection coating), a combined layer of BARC and a photo resist (PR) or just a layer of PR is formed on a metal film for patterning the metal film to form a semiconductor device. The patterned metal film is an electrode such as gate electrode, source/drain electrode, or wiring layer, in some embodiments of the present disclosure. If adhesion between the metal film and the BARC and/or the PR film and the metal film is poor, a wet etching process using a halide, such as HF, can easily pull the BARC and/or PR film away from the metal film. Pulling the BARC and/or PR film away from the metal film leads to inaccurate pattern formation. A device formed under this situation with the BARC and/or PR film partially or completely pulled away from the metal film may be defective and/or inoperable.

Oxidation treatment using oxygen ($O_2$) plasma or ozone ($O_3$) may improve the surface property of the metal film but an undesirable oxidation layer may be formed in the device, which could induce an error of wafer acceptance test (WAT) drift. A method of increasing adhesion of BARC and/or PR on the silicon wafer surface is to treat the wafer with hexamethyldisilazane (HMDS) because a new silicon wafer usually has a polar surface on which water molecules are adsorbed. However, HMDS treatment may not sufficiently enhance such adhesion, especially for a metallic layer. The HMDS method requires an undesirably heating to 120° C. to vaporize HMDS. Therefore, a method to enhance the adhesion between the BARC and/or PR and the metallic layer is desired.

The present disclosure relates to a treatment method of a metal film and a bottom anti-reflection coating (BARC) or photo resist (PR) material film. In particular, the present disclosure relates to a treatment method of a metal film, before coating with a BARC or PR material film, by treating the metal film with an alkaline solution, such as tetramethylammonium hydroxide (TMAH), i.e. $[(CH_3)_4N]^+OH^-$. The surface treatment provides the metallic layer with a hydrophilic surface layer. In some embodiments, the BARC includes an organic material.

Anti-reflective materials include bottom anti-reflective coating (BARC) materials. There are two general categories of BARC materials, inorganic and organic. Also, BARC materials are further classified as have dry and wet types. Dry type BARC is a plasma-developable BARC, while the wet type is developer-soluble. Wet type BARC is used in some embodiments, such as ion implantation and CD control, and is removed with a developer, such as a TMAH solution. FIG. 1 shows the chemical formula of tetramethylammonium hydroxide TMAH, i.e. $[(CH_3)_4N]^+OH^-$. TMAH is a strong alkaline solution and has an ionic bonding structure with a positively charged ionic group containing methyl groups ($CH_3$) singly bonded to a nitrogen atom, and a hydroxyl group as the negative ion. In some embodiments of the disclosure, a TMAH aqueous solution, is applied before a layer of organic BARC material is formed.

In some embodiments, the TMAH is applied for a time duration of about 5 to about 75 seconds at temperature of about 22 to about 45° C., at a TMAH concentration of about 2.38 to about 5.38%. The TMAH treatment modifies the surface of the metal, resulting in nanoscale structures which promote interaction and adhesion with BARC, according to some embodiments of the present disclosure. In this way, the TMAH preserves the BARC loss due to weak adhesion and strengthens the bond between the BARC and the semiconductor wafer or substrate.

FIGS. 2-9 show a sequential process for manufacturing a semiconductor device according to an embodiment of the present disclosure. It is understood that additional operations can be provided before, during, and after the processes shown by FIGS. 2-9, and some of the operations described below can be replaced or eliminated in other embodiments of the method. The order of the operations/processes may be interchangeable.

Figure 2:
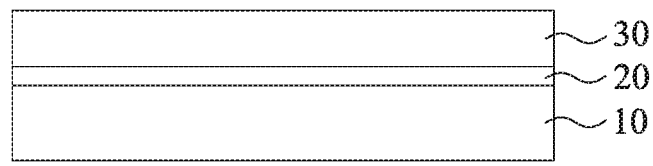
FIGS. 2, 3, 4, 5, 6, 7, 8, and 9 show sequential cross-sectional views of a method of manufacturing a semiconductor device, according to some embodiments of the present disclosure.

FIG. 2 shows a cross-sectional view of a semiconductor device including a substrate 10, a dielectric layer 20, and a metallic layer 30, which can function as a gate electrode, source/drain electrode, a capacitor electrode, or a wiring layer.

In some embodiments, the substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from about 30 atomic % germanium for the bottom-most buffer layer to about 70 atomic % germanium for the top-most buffer layer. In some embodiments of the present disclosure, the substrate 10 includes various regions that have been suitably doped with impurities (e.g., p-type or n-type conductivity) for example, boron ($BF_2$) for an n-type FinFET and phosphorus for a p-type FinFET.

In FIG. 2, a dielectric layer 20 is formed on the substrate 10 and functions as an insulating barrier between the metallic layer 30 and the substrate 10. The dielectric layer 20 includes an oxide layer having a thickness of about 5 to 50 nm, according to some embodiments of the present disclosure. The metallic layer 30 is formed on the dielectric layer 20 and includes a layer of conductive material having a thickness of about 20 to 100 nm, according to some embodiments of the present disclosure. The metallic layer 30 also includes one or more layers of polysilicon, amorphous silicon (a-Si), aluminum (Al), tungsten (W), titanium (Ti), titanium nitride (TiN), titanium-aluminum alloy (TiAl), titanium-aluminum carbide (TiAlC), tantalum (Ta), tantalum nitride (TaN), copper (Cu), aluminum copper alloy (AlCu), nickel (Ni) and cobalt (Co), in some embodiments of the present disclosure. In certain embodiments, the metallic layer 30 includes multiple layers where the uppermost layer of the metallic layer 30 is metallic (metal or metal alloy).

Figure 3:
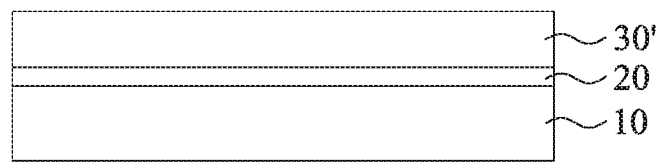

In FIG. 3, the metallic layer 30 is surface-treated by TMAH by spraying TMAH having a concentration of about 2.38 to about 5.38%, toward the metallic layer 30 using a nozzle at an angle from about 90 degree (vertical) to about 45 degree. The duration of treating the metallic layer 30 with the TMAH is about 5 to about 75 seconds at temperature of about 22 to about 45° C., according to some embodiments of the present disclosure.

The surface of metallic layer 30 is treated by TMAH using a dynamic route or a static route. The dynamic route involves spraying the TMAH onto a spinning substrate 10 with the metallic layer 30 for about 5 to about 75 seconds at temperature of about 22 to about 45° C., then rinsing the spinning metallic layer 30 with distilled water, and then finally drying the spinning metallic layer 30', according to some embodiments of the present disclosure. The static route involves spaying the TMAH onto the metallic layer 30 disposed on the substrate 10, which is not spinning, then spin coating the TMAH on the metallic layer 30, then without spinning the metallic layer 30, applying the TMAH for about 5 to about 75 seconds at temperature of about 22 to about 45° C., then rinsing the metallic layer 30 with distilled water, and the drying the surface-treated metallic layer 30', according to some embodiments of the present disclosure.

Figure 4:
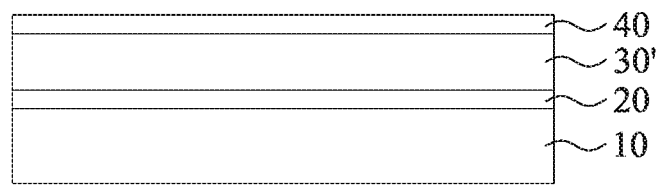
Figure 5:
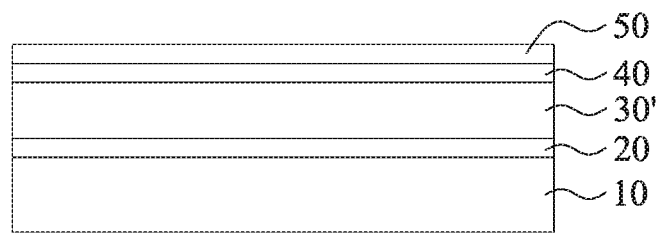
Figure 6:
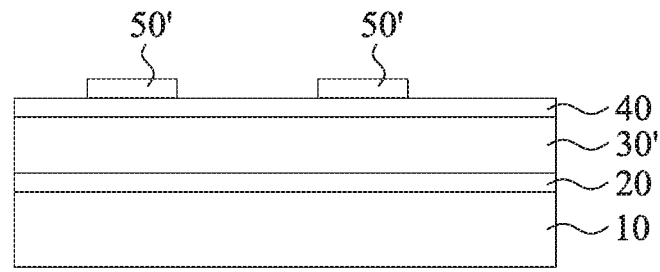

After the surface treatment using TMAH, FIG. 4 shows that a layer of BARC 40 is formed on the TMAH surface-treated metallic layer 30'. The thickness of the BARC layer 40 is formed to facilitate the occurrence of destructive interference of the exposure light for patterning a photo resist layer formed on the TMAH surface-treated metallic layer 30'. The BARC layer 40 is formed to suppress light reflection of the exposure light for patterning the photo resist layer, and absorb the light. In this way, narrow width metallic patterns can be formed by patterning the photo resist layer formed on the TMAH surface-treated metallic layer 30'. In FIG. 5, a photo resist layer 50 is formed by spin-coating or other suitable methods. The photo resist layer 50 is patterned using photolithography to form a photo resist pattern 50' as shown in FIG. 6. In FIG. 6, a gap 60 is formed between the spaced-part patterns 50' of the photo resist layer 50. The patterning process is carried out using ultraviolet (UV), deep UV (DUV) or extreme UV (EUV) photolithography, in some embodiments of the present disclosure.

Figure 7:
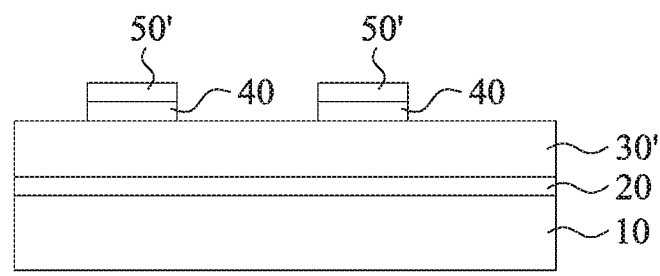

In FIG. 7, the patterned photo resist layer 50 is used as a mask to pattern the BARC layer 40, in some embodiments of the present disclosure. The exposed portions of the BARC layer 40 are removed by anisotropic plasma etching, in some embodiments of the present disclosure. After the patterning process, the gaps 60 are extended further downward toward the semiconductor substrate 10, in some embodiments of the present disclosure.

The patterned photo resist layer 50' is removed by wet stripping or plasma ashing, in some embodiments of the present disclosure. In other embodiments, the patterned photo resist layer 50' remains until the TMAH surface-treated metallic layer 30' is patterned and is removed together with the BARC layer 40.

Figure 8:
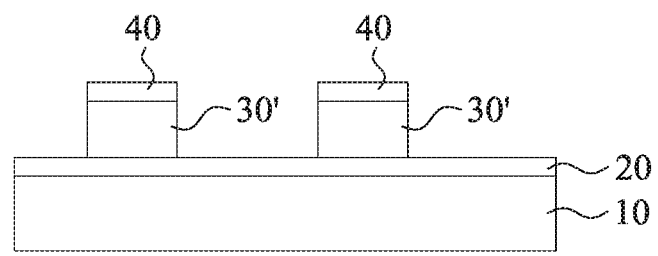

In FIG. 8, the metallic layer 30 is etched by anisotropic etching, in some embodiments. The BARC layer 40 protects the portions of TMAH surface-treated metallic layer 30' not intended to be etched away. The remaining portions of the metallic layer 30' are electrodes or conductive wirings, in some embodiments of the present disclosure. In this way, the gaps 60 are extended further downward toward the semiconductor substrate 10. During this etching, any remaining photo resist layer 50' is removed, in other embodiments of the present disclosure.

Figure 9:
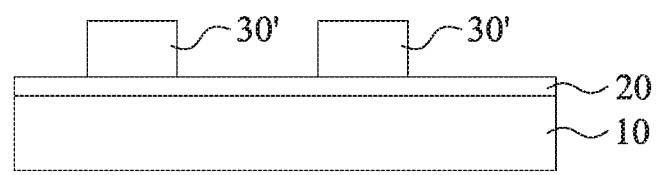

In FIG. 9, the remaining portions of the BARC layer 40 is removed, in some embodiments. In this way, the above disclosed operations form electrodes of a transistor, such as planar transistor (such as MOSFET) or fin-type transistor (such as FinFET or GAAFET), source/drain electrode, capacitor electrode, or wiring layers.

Throughout the operations, no treatment with hexamethyldisilazane (HMDS) is performed directly on the metallic 30 in some embodiments.

FIGS. 10-22 show a sequential process for manufacturing a semiconductor device according to an embodiment of the present disclosure. It is understood that additional operations can be provided before, during, and after processes shown by FIGS. 10-22, and some of the operations described below can be replaced or eliminated, for additional embodiments of the method. The order of the operations/processes may be interchangeable. Materials, configurations, dimensions, processes, and/or operations the same as or similar to those explained with respect to FIGS. 2-9 may be employed in the following embodiments, and the detailed explanation thereof may be omitted.

Figure 10:
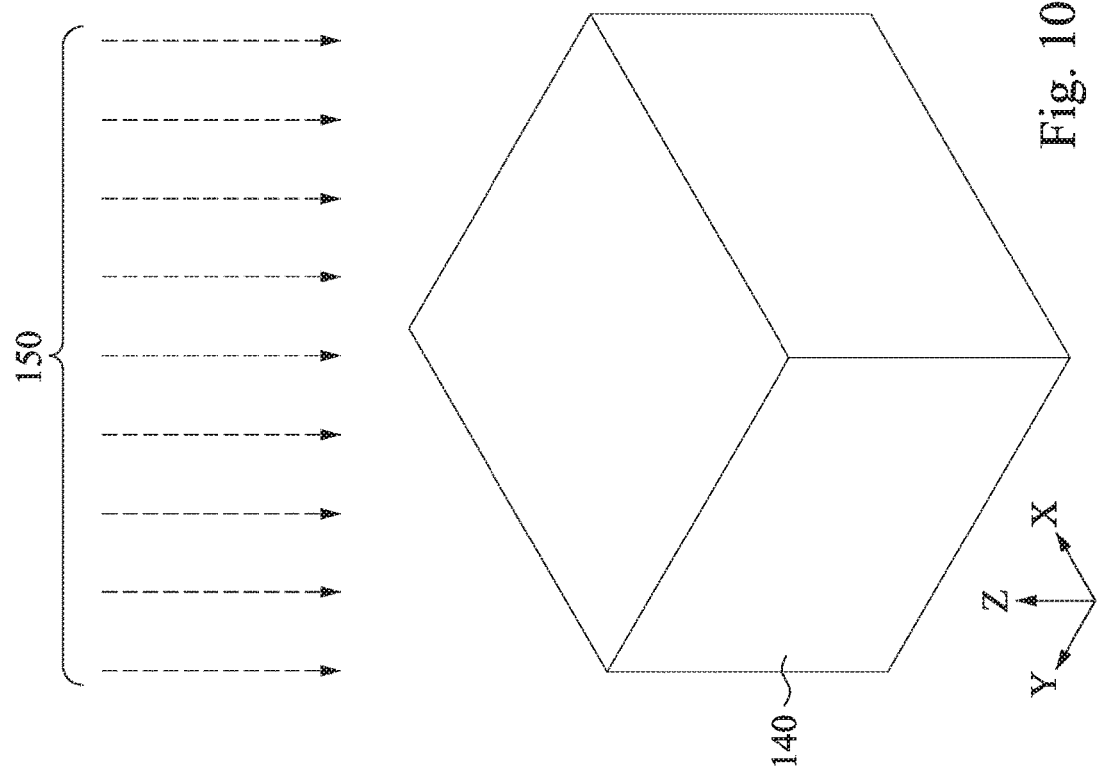

As shown in FIG. 10, impurity ions (dopants) 150 are implanted into a semiconductor substrate 140 to form a well region. The ion implantation is performed to prevent a punch-through effect. In one embodiment, substrate 140 includes a single crystalline semiconductor layer on at least it surface portion. The substrate 140 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 140 is made of Si. The substrate 140 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 140 comprises silicon germanium (SiGe) buffer layers epitaxially grown on the silicon substrate 140. The germanium concentration of the SiGe buffer layers may increase from 30 atomic % germanium for the bottom-most buffer layer to 70 atomic % germanium for the top-most buffer layer. In some embodiments of the present disclosure, the substrate 140 includes various regions that have been suitably doped with impurities (e.g., p-type or n-type conductivity). The dopants 150 are, for example, boron ($BF_2$) for an n-type FinFET and phosphorus for a p-type FinFET.

Figure 11:
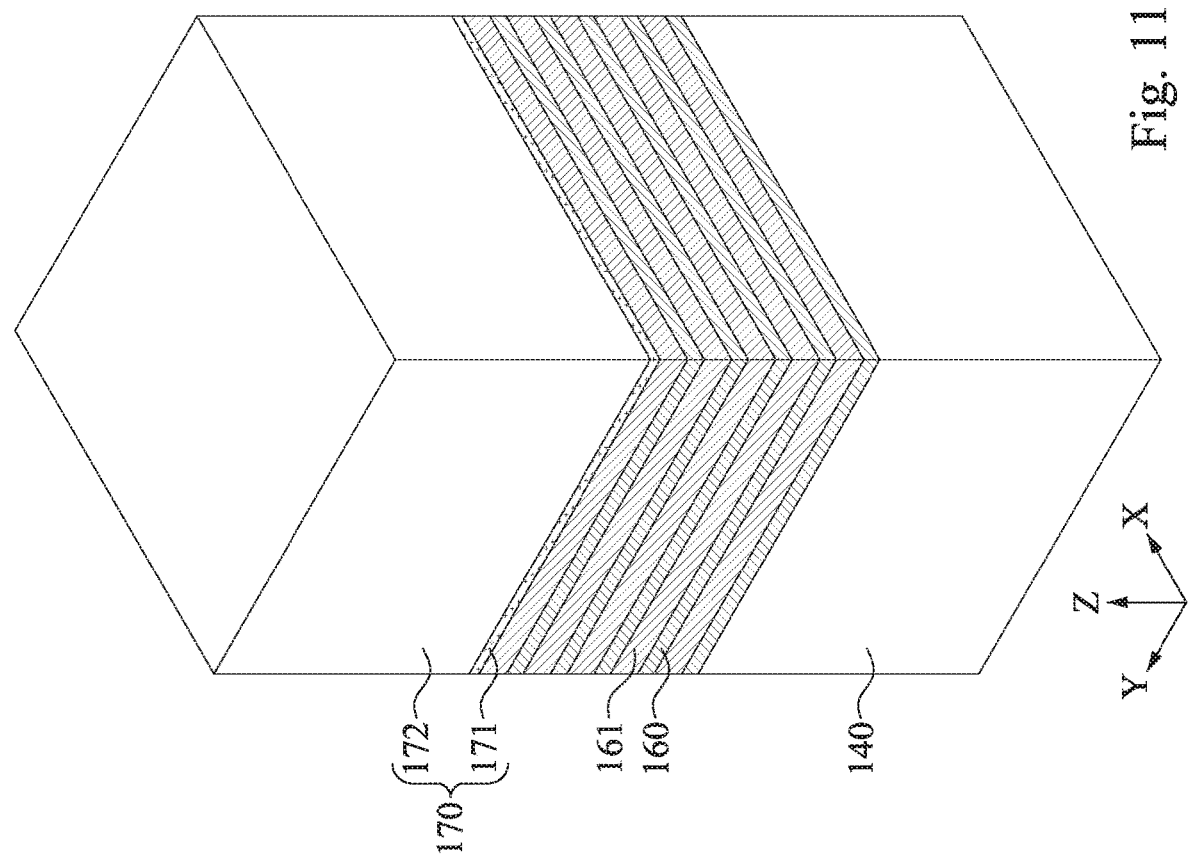

In FIG. 11, stacked semiconductor layers are formed over the substrate 140, in a case where a gate all-around (GAA) field effect transistor (FET) is fabricated. The stacked semiconductor layers include first semiconductor layers 160 and second semiconductor layers 161. The first semiconductor layers 160 and the second semiconductor layers 161 are formed of materials having different lattice constants, and include one or more layers of Si, Ge, SiGe, GaAs, InSb, GaP, GaSb, InAlAs, InGaAs, GaSbP, GaAsSb or InP, according to some embodiments of the present disclosure.

In some embodiments, the first semiconductor layers 160 and the second semiconductor layers 161 are formed of Si, a Si compound, SiGe, Ge or a Ge compound. In one embodiment, the first semiconductor layers 160 are $Si_{1-x}Ge_x$, where x is more than about 0.3, or Ge (x=1.0) and the second semiconductor layers 161 are Si or $Si_{1-y}Ge_y$, where y is less than about 0.4 and x>y. In this disclosure, an "M" compound" or an "M based compound" means the majority of the compound is M.

In another embodiment, the second semiconductor layers 161 are $Si_{1-y}Ge_y$, where y is more than about 0.3, or Ge, and the first semiconductor layers 160 are Si or $Si_{1-x}Ge_x$, where x is less than about 0.4 and x<y. In yet other embodiments, the first semiconductor layer 160 is made of $Si_{1-x}Ge_x$, where x is in a range from about 0.3 to about 0.8, and the second semiconductor layer 161 is made of $Si_{1-x}Ge_x$, where x is in a range from about 0.1 to about 0.4.

Also, in FIG. 11, five layers of the first semiconductor layer 160 and six layers of the second semiconductor layer 161 are disposed. However, the number of the layers is not limited to five, and may be as small as one (each layer) and in some embodiments, two to ten layers of each of the first and second semiconductor layers are formed. By adjusting the numbers of the stacked layers, a driving current of the GAA FET device can be adjusted.

The first semiconductor layers 160 and the second semiconductor layers 161 are epitaxially formed over the substrate 140. The thickness of the first semiconductor layers 160 may be equal to or greater than that of the second semiconductor layers 161, and is in a range from about 5 nm to about 50 nm in some embodiments, and is in a range from about 10 nm to about 30 nm in other embodiments. The thickness of the second semiconductor layers 161 is in a range from about 5 nm to about 30 nm in some embodiments, and is in a range from about 10 nm to about 20 nm in other embodiments. The thickness of each of the first semiconductor layers 160 may be the same, or may vary. In some embodiments, the bottom first semiconductor layer 160 (the closest layer 160 to the substrate 140) is thicker than the remaining first semiconductor layers 160. The thickness of the bottom first semiconductor layer 160 is in a range from about 10 nm to about 50 nm in some embodiments, or is in a range from about 20 nm to about 40 nm in other embodiments.

Further, in FIG. 11, a mask layer 170 is formed over the stacked layers 160 and 161. In some embodiments, the mask layer 170 includes a first mask layer 171 and a second mask layer 172. The first mask layer 171 is a pad oxide layer made of a silicon oxide, which can be formed by a thermal oxidation. The second mask layer 172 is made of a silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 170 is patterned into a mask pattern by using patterning operations including photo-lithography and etching. In some embodiments, the first mask layer 171 is made of silicon nitride and the second mask layer 172 is made of silicon oxide.

Figure 12A:
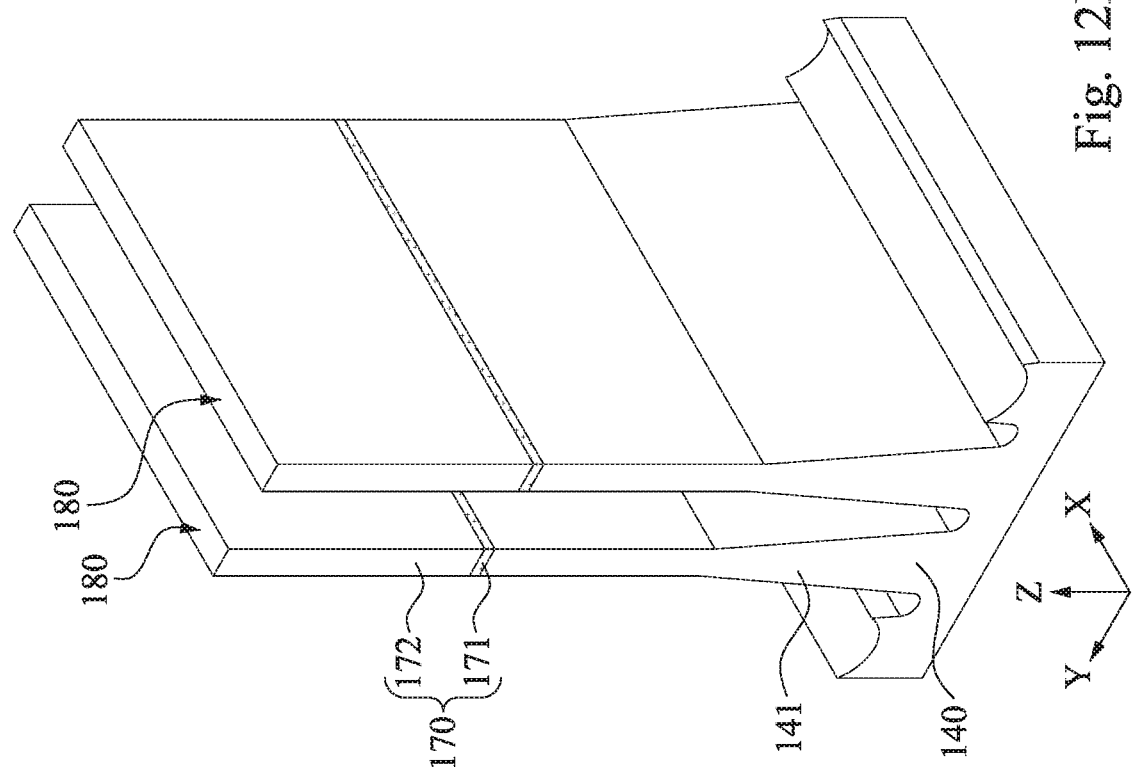
Figure 12B:
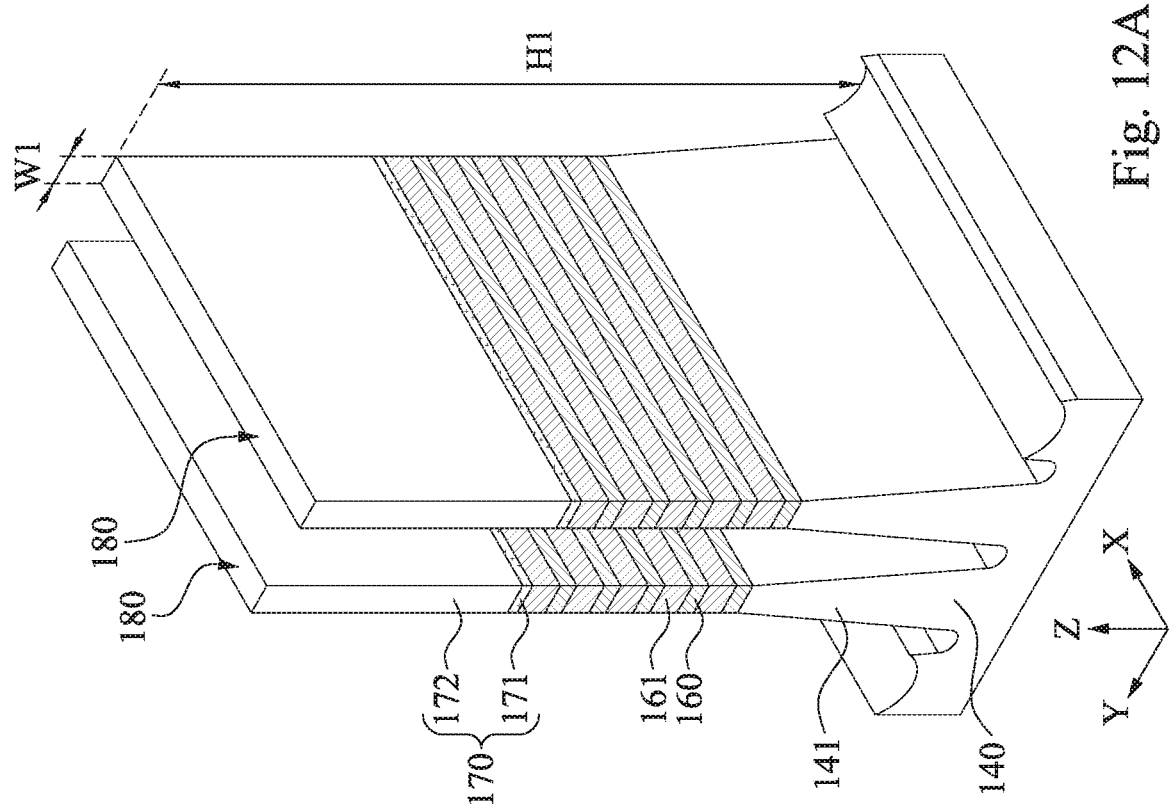

When the semiconductor device is a FinFET, no stacked layers are formed (see FIGS. 12B and 13B). In some embodiments, one or more epitaxial layers for a channel region are formed over the substrate 140. For GAA FET devices, operations shown in FIGS. 12A and 13A are applied. In FIG. 12A, the stacked layers of the first and second semiconductor layers 160, 161 are patterned by using the patterned mask layer 170, thereby the stacked layers 160 and 161 are formed into fin structures 180 extending in a lengthwise direction along the x direction. In some embodiments of the present disclosure, the fin structures 180 are formed by patterning using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. In some embodiments of the present disclosure, the photolithographic method includes ultraviolet (UV) photolithography, deep ultraviolet (DUV) photolithography, and extreme ultraviolet (EUV) photolithography.

In FIG. 12A, two fin structures 180 are arranged in the y direction but the number of the fin structures 180 is not limited to, and may be as small as one and three or more in some embodiments of the present disclosure. In some embodiments, one or more dummy fin structures are formed on both sides of the fin structures 180 to improve pattern fidelity in the patterning operations. As shown in FIG. 12A, the fin structures 180 have upper portions constituted by the stacked semiconductor layers 160, 161 and well portions 141. The width W1 of the upper portion of the fin structure 180 along the y direction is in a range from about 10 nm to about 40 nm in some embodiments, and is in a range from about 20 nm to about 30 nm in other embodiments. The height H1 along the z direction of the fin structure 180 is in a range from about 100 nm to about 200 nm.

FIG. 12B shows the case for a FinFET device. For a FinFET device, the substrate 140 (and/or an epitaxial layer formed over the substrate) is etched to form one or more fin structures. In FIG. 12B, the mask layer 170 including first mask layer 171 and second mask layer 172 formed on the substrate 140 is patterned by using the patterned mask layer 170, thereby the substrate 140 is formed into fin structures 180 extending in the lengthwise direction along the x direction. In FIG. 12B, two fin structures 180 are arranged in the y direction but the number of the fin structures 180 is not limited to two, and may be as small as one and three or more in some embodiments of the present disclosure, depending on the desired device performance and device architecture. In some embodiments, one or more dummy fin structures (not shown) are formed on both sides of the fin structures 180, i.e. between the two fin structures 180, to improve pattern fidelity in the patterning operations such as photolithographic patterning of the mask layer 170. As shown in FIG. 12B, the substrate 140 has well portions 141.

After the fin structures 180 are formed in FIG. 12A or FIG. 12B, an insulating material layer 200 including one or more layers of insulating material is formed over the substrate 140 in FIG. 13A or FIG. 13B so that the fin structures 180 are fully embedded in the insulating material layer 200. The insulating material for the insulating material layer 200 includes silicon oxide, silicon nitride, silicon oxynitride (Si—O—N), silicon carbon nitride (Si—C—N), silicon carbon oxynitride (Si—C—O—N), fluorine-doped silicate glass (FSG), or a low-k dielectric material, formed by LPCVD (low pressure chemical vapor deposition), plasma-CVD or flowable CVD. An anneal operation is performed after the formation of the insulating layer 200 in some embodiments of the present disclosure. Then, a planarization operation, such as a chemical mechanical polishing (CMP) method and/or an etch-back method, is performed such that the upper surface of the uppermost second semiconductor layer 161 or fin structure 180 is exposed from the insulating material layer 600 as shown in FIGS. 13A and 13B. In some embodiments, the first and second mask layers 171 and 172 are removed by the CMP as shown in FIGS. 13A and 13B, and in other embodiments, the CMP operation stops on the second mask layer 172. In some embodiments, a first liner layer or fin liner 190 is formed over the structure of FIGS. 12A and 18B before forming the insulating material layer 200, as shown FIG. 13A or FIG. 13B. The fin liner or first liner layer 190 is formed of silicon nitride Si—N or a silicon nitride-based material (e.g., silicon oxynitride Si—O—N, silicon carbon nitride Si—C—N, or silicon carbon oxynitride Si—C—O—N).

Figure 14A:
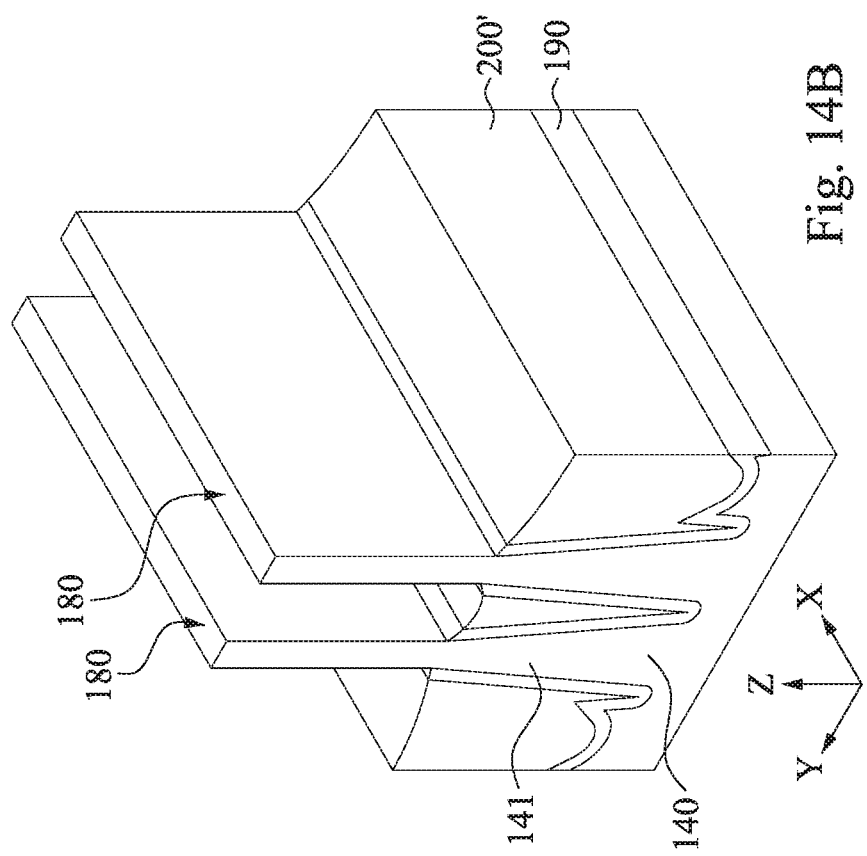
Figure 14B:
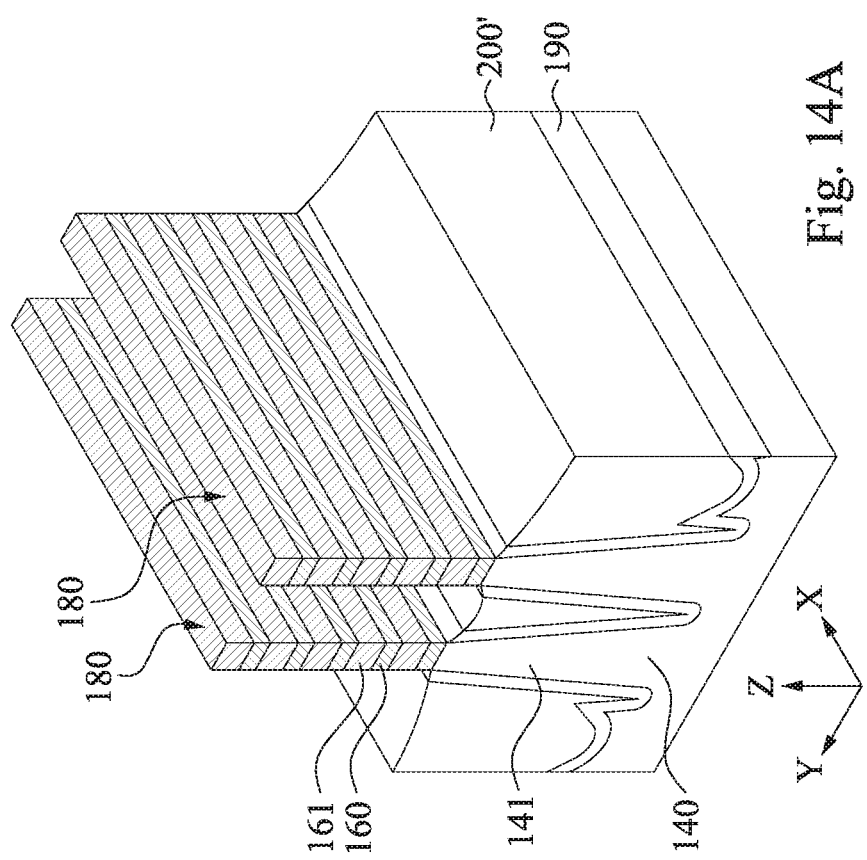

Then, as shown in FIG. 14A or FIG. 14B, the insulating material layer 200 is recessed to form an isolation insulating layer 200' so that the upper portions of the fin structures 180 are exposed. With this operation, the substrate 140 and the well portions 141 of the fin structures 180 are electrically separated from each other by the isolation insulating layer 200', which is also called a shallow trench isolation (STI) layer. In the embodiment shown in FIG. 14A, the insulating material layer 200 is recessed until the bottommost first semiconductor layer 160 is exposed. In other embodiments of the present disclosure, the upper portion of the well layer 161 is also partially exposed. The first semiconductor layers 160 are sacrificial layers which are subsequently partially removed, and the second semiconductor layers 161 are subsequently formed into channel layers of a GAA FET device.

Figure 15A:
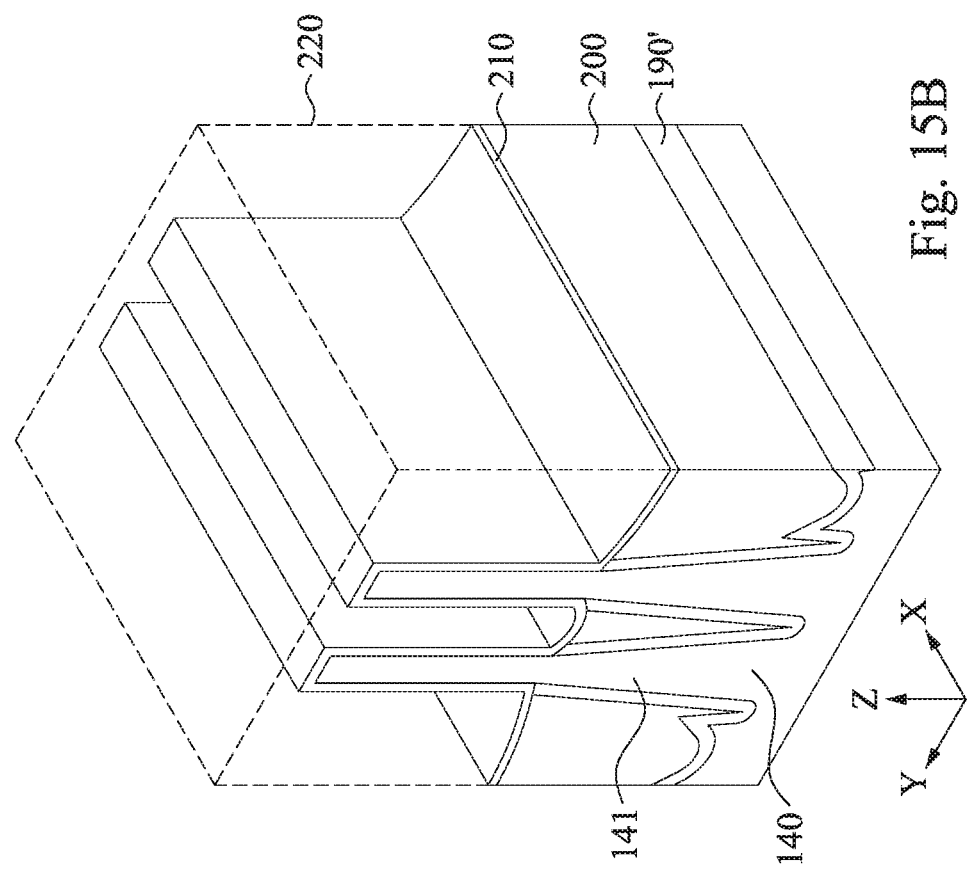
Figure 15B:
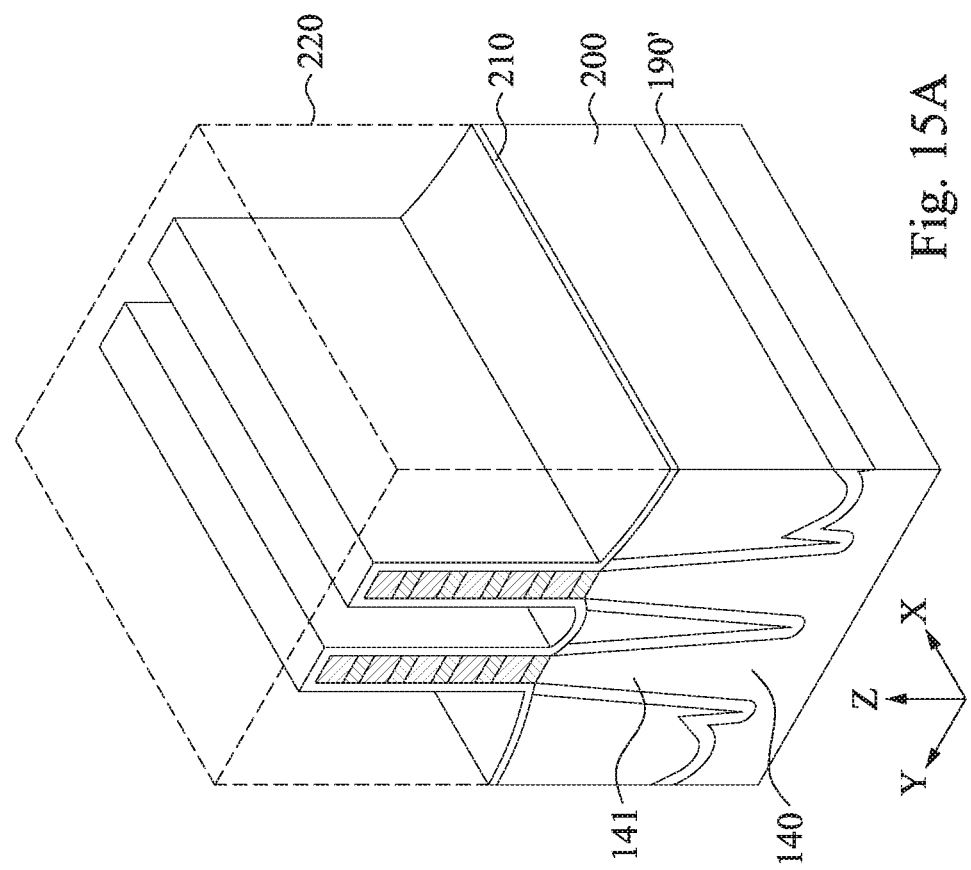

After the isolation insulating layer 200 is formed, a sacrificial gate dielectric layer 210 is formed, as shown in FIG. 15A or FIG. 15B. The sacrificial gate dielectric layer 210 includes one or more layers of insulating material, such as a silicon oxide-based material including $SiO_2$. In one embodiment, silicon oxide formed by chemical vapor deposition (CVD), including low pressure CVD (LPCVD) and plasma enhanced CVD (PECVD), physical vapor deposition (PVD), atomic layer deposition (ALD), or other suitable process is used. The thickness of the sacrificial gate dielectric layer 210 is in a range from about 1 nm to about 5 nm in some embodiments of the present disclosure. The sacrificial gate dielectric layer 210 is formed over the fin structure 180.

Figure 16A:
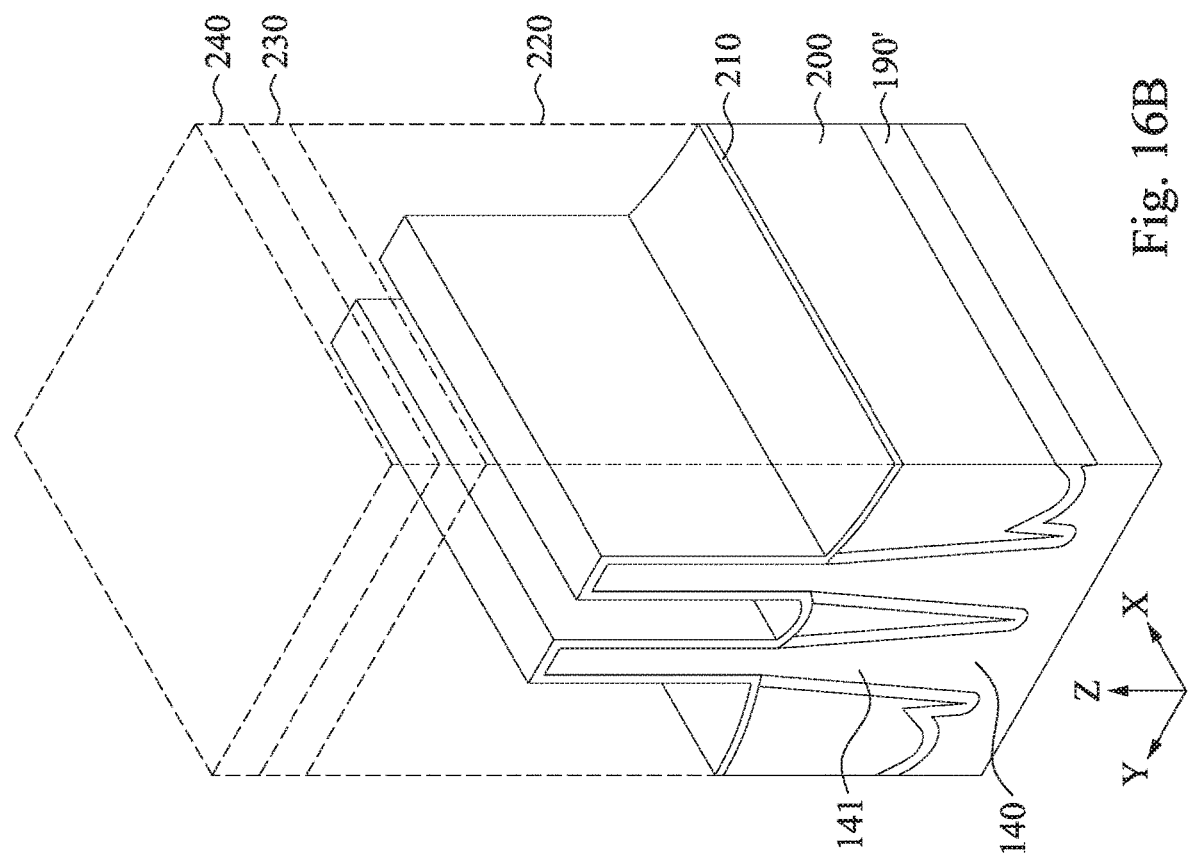
Figure 16B:
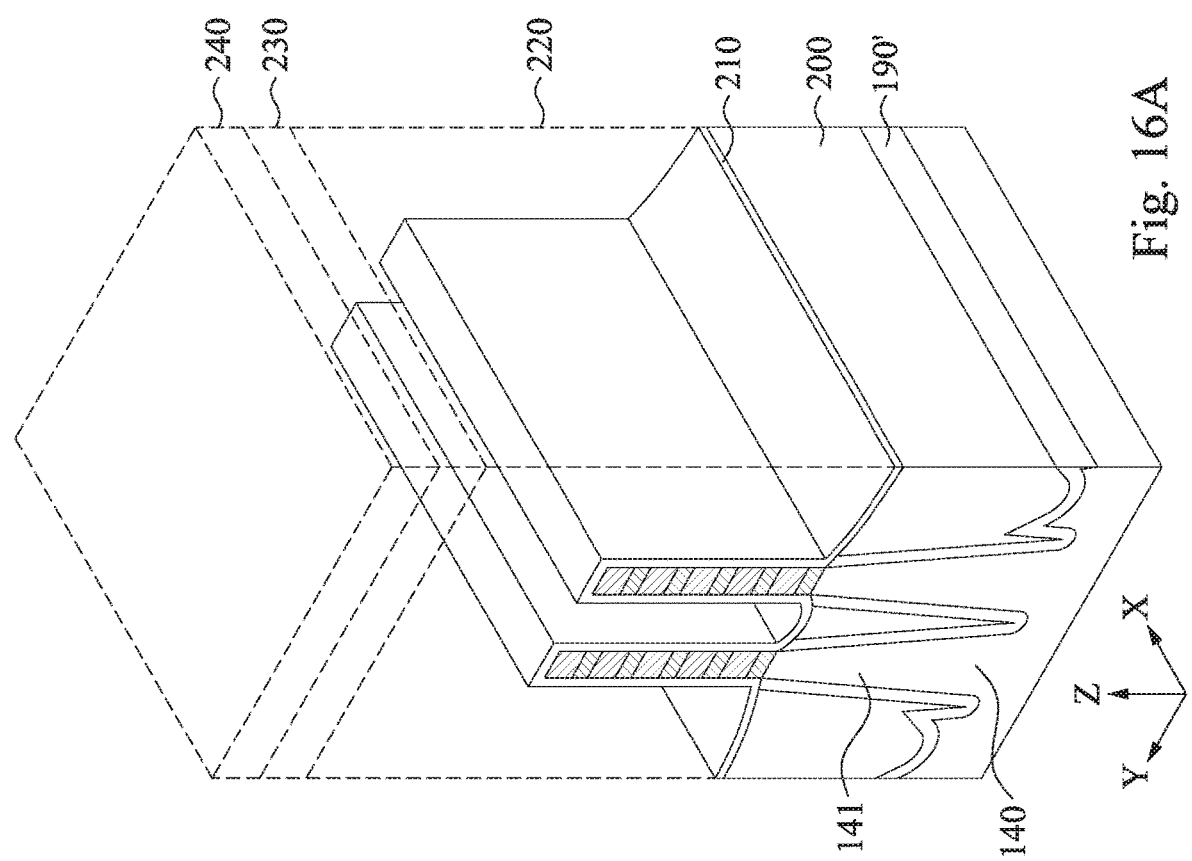

FIGS. 16A and 16B show schematic views of the substrates of FIGS. 15A and 15B, respectively, according to some embodiments of the present disclosure. In FIGS. 16A and 16B, in some embodiments of the present disclosure, the fin structures 180 are formed on the substrate 140 and extend in a lengthwise direction along x-direction. Each of the fin structures 180 has two fin edge regions at opposite ends along the lengthwise direction of the fin structures 180 along the x-direction. One or more channel regions are formed between the fin ends. In some embodiments of the present disclosure, the separation between the fin structures 180 depends on the device design, such as density of FinFET devices in a processor chip and the performance requirement of the semiconductor device having such a FinFET structure.

Figure 17:
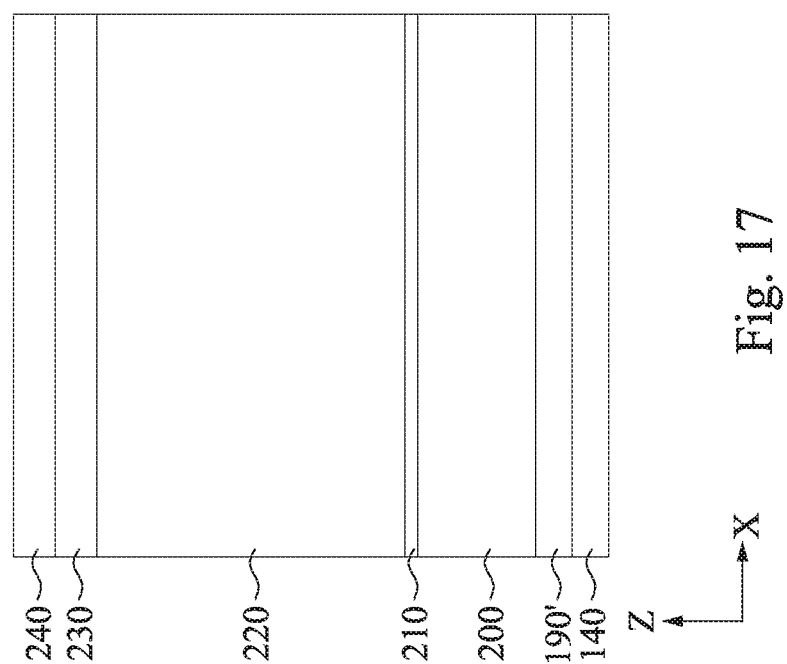

Also, in FIGS. 16A and 16B, a gate conductive layer 220 is formed on the gate dielectric layer 210 and includes a layer of polycrystalline silicon, according to some embodiments of the present disclosure. In other embodiments, gate conductive layer 220 includes layers of amorphous silicon (α-Si), aluminum (Al), tungsten (W), titanium (Ti), titanium nitride (TiN), titanium-aluminum alloy (TiAl), titanium-aluminum carbide (TiAlC), tantalum (Ta), tantalum nitride (TaN), copper (Cu), aluminum copper alloy (AlCu), nickel (Ni) and cobalt (Co). The gate conductive layer is surface-treated by TMAH using the aforementioned dynamic route or static route. Then, a layer of BARC material 230 is formed on the TMAH surface-treated gate conductive layer 220, in some embodiments of the present disclosure. The BARC layer 230 suppresses light reflection of the exposure light for patterning the gate conductive layer 220, absorbs the light energy, and/or reduces the light intensity by destructive interference. In this way, narrow width gates formed by patterning the gate conductive layer 220 can be achieved. A photo resist layer 240 is formed over the BARC layer 230. The views of the devices in FIGS. 16A and 16B in the x-z plane are the same and thus only one view is shown in each of the FIGS. 17, 18, 19, and 20 for both embodiments in FIGS. 16A and 16B. FIG. 17 shows the same side view of the embodiments of FIGS. 16A and 16B.

Figure 18:
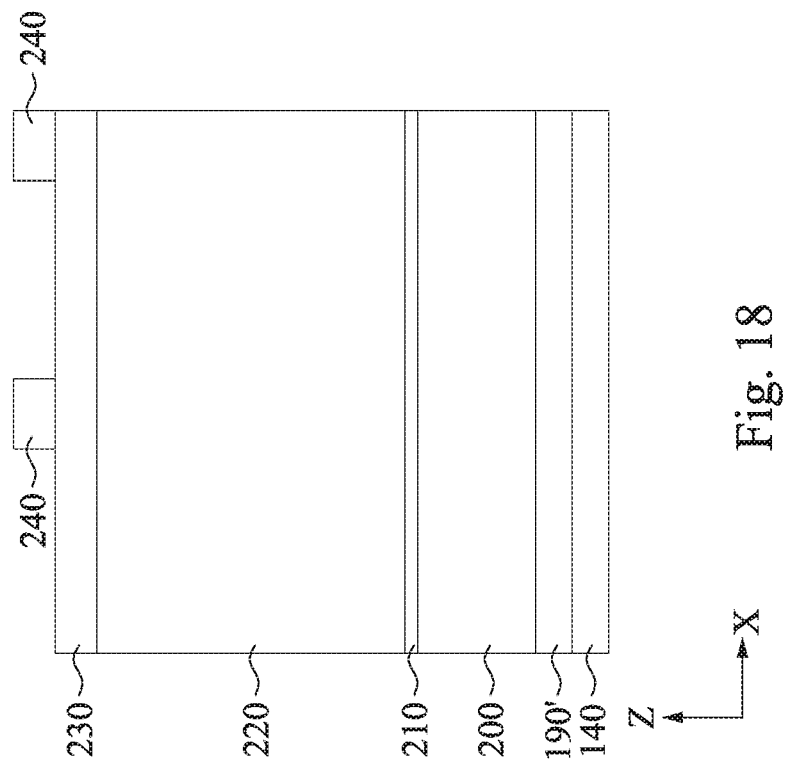

In FIG. 18, the photo resist layer 240 is patterned by photolithography and etching. The patterning process is carried out using ultraviolet (UV) or deep UV (DUV) photolithography, in some embodiments of the present disclosure. Then, in FIG. 19, the patterned the photo resist layer 240 is used as a mask to pattern the BARC layer 230, in some embodiments of the present disclosure. The exposed portions of the BARC layer 230 are removed by anisotropic etching, in some embodiments of the present disclosure. After the patterning process, the space gap between the patterns of the photo resist layer 240 extends further downward and toward the semiconductor substrate 140, in some embodiments of the present disclosure.

Figure 21A:
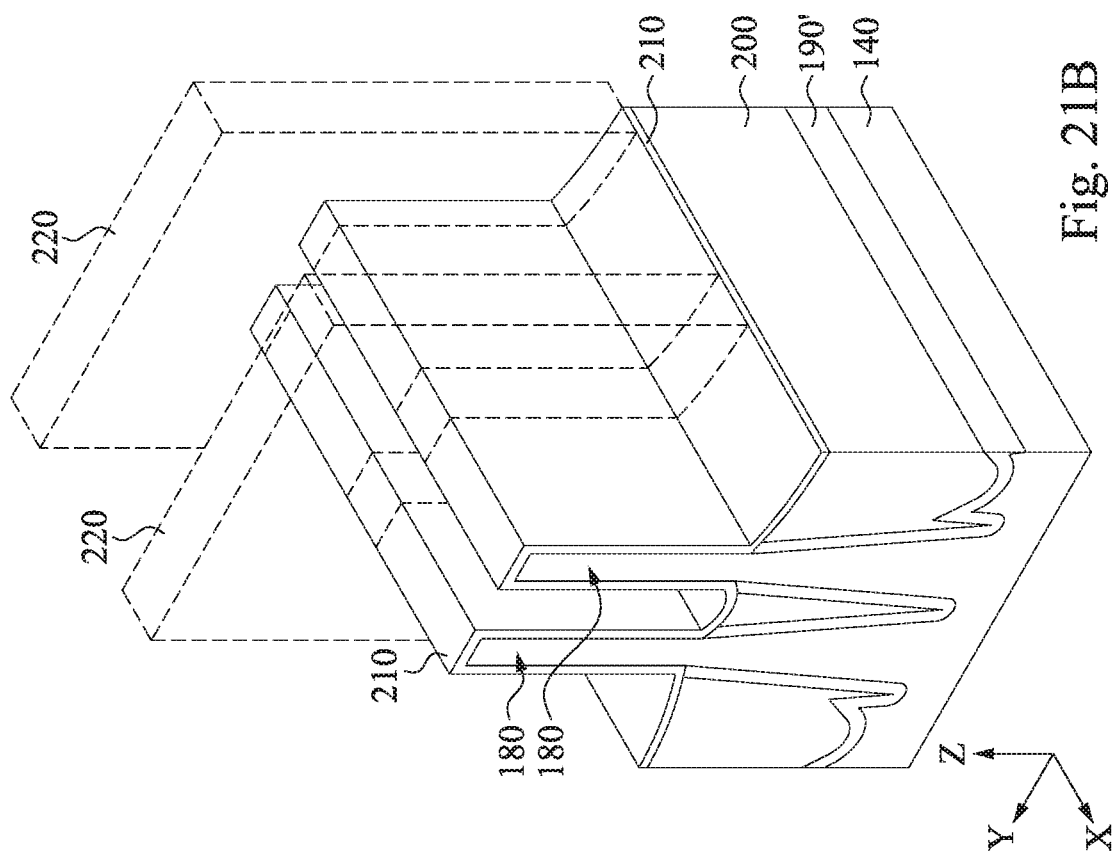
Figure 21B:
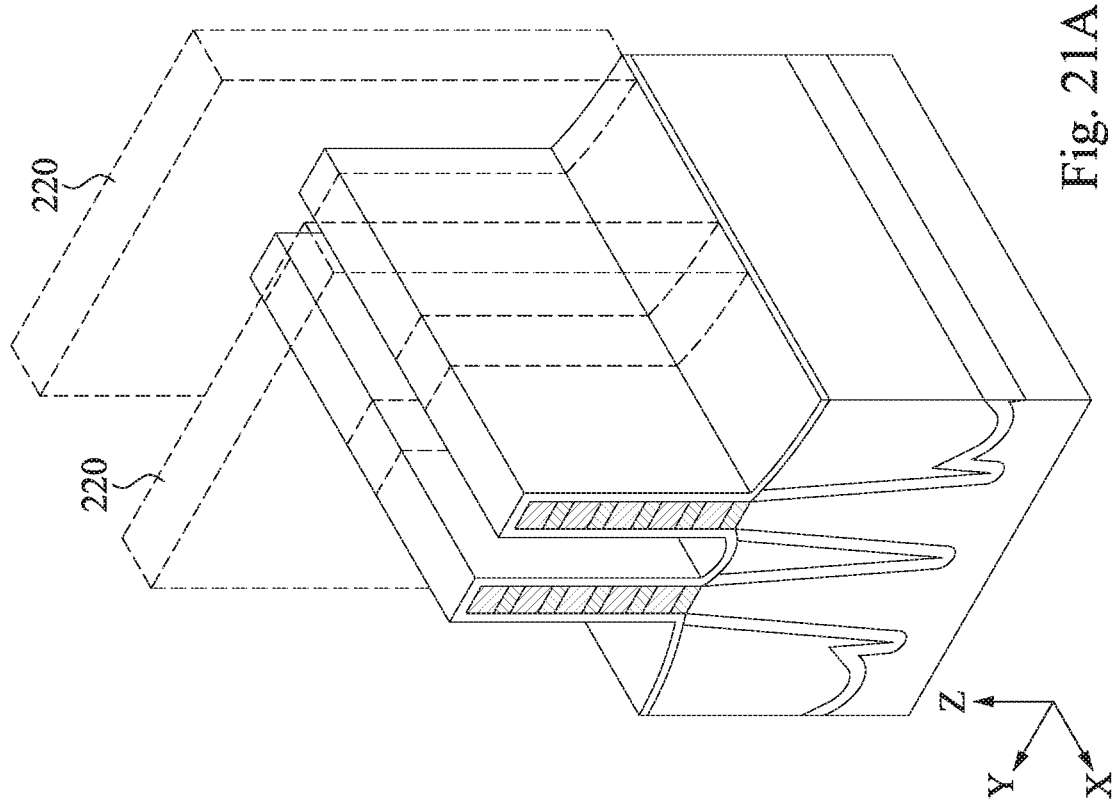

In FIG. 20, the patterned photo resist layer 240 is removed by wet stripping, in some embodiments of the present disclosure. The TMAH surface-treated gate conductive layer 220 is etched by anisotropic etching. The BARC layer 230 protects the portions of gate conductive layer 220 not intended to be etched away. The remaining portions of the gate conductive layer 220 are formed to be gate electrode in some embodiments of the present disclosure. In this patterning operation, the gate dielectric layer 210 is not removed, in some embodiments of the present disclosure. The remaining portions of the BARC layer 230 are removed (FIGS. 21A and 21B), in some embodiments. In this way, the gate electrodes of the multi-fin transistor are completely formed. In FIGS. 21A and 21B, only the outlines of the patterned TMAH surface-treated gate conductive layers 220 are shown.

Figure 22:
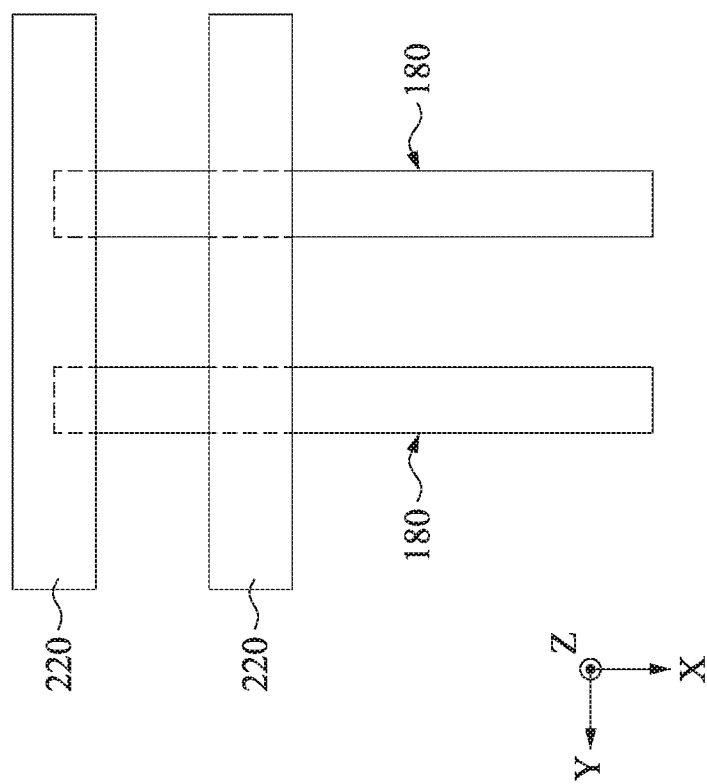

FIGS. 21A and 21B are isometric views of the devices formed with patterned TMAH surface-treated gate electrode layer 220 and FIG. 22 is a plan view of the devices of FIGS. 21A and 21B. Since the top plan views of the devices in FIGS. 21A and 21B are the same, only one view is shown in FIG. 22. In FIG. 22, one of the gate electrode layers 220 is formed at the end of the fin while the other gate electrode layer 220 is formed in a region between fin ends of a fin. Thus, the present disclosure provides a flexible method of forming different types of gate electrode layers 220 (e.g. fin-end type or mid-fin types).

Figure 23:
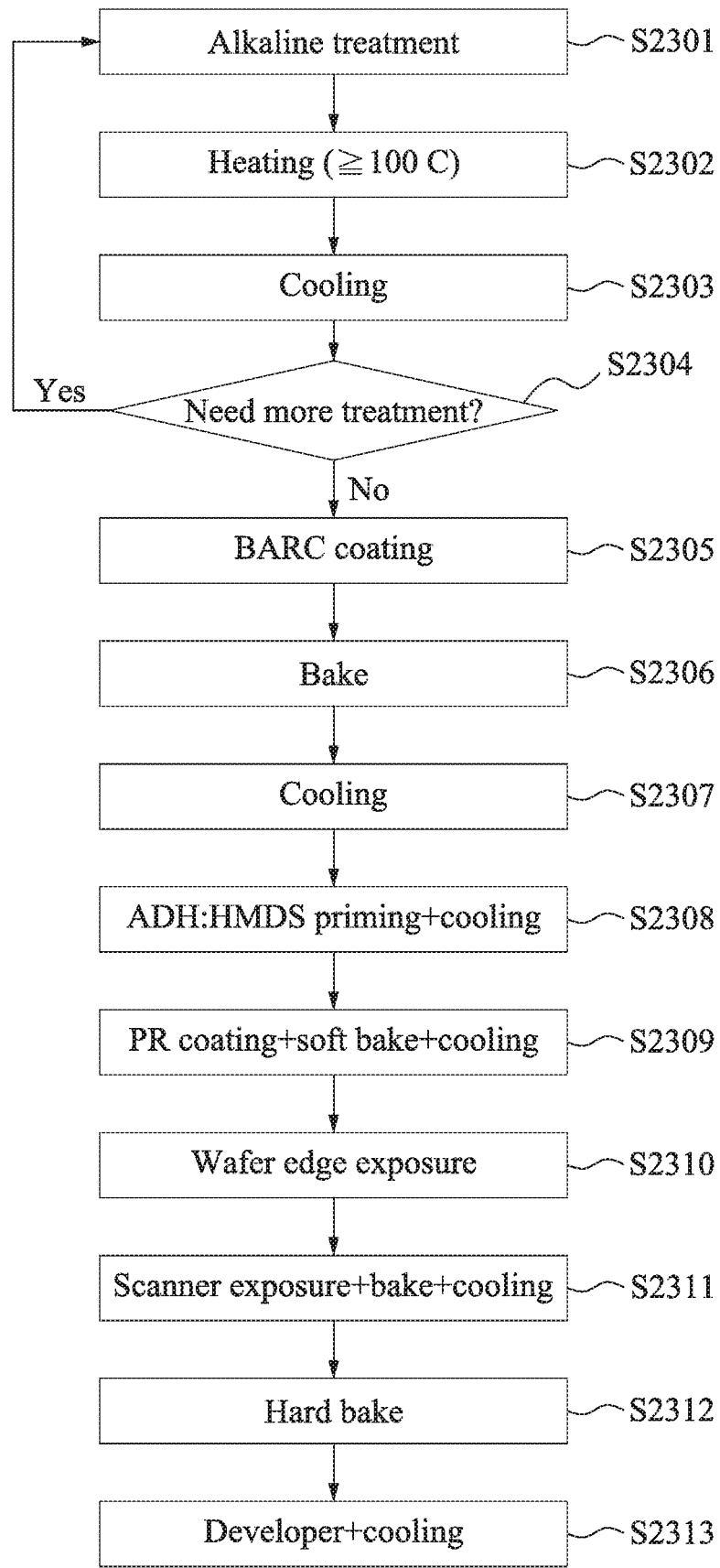
FIG. 23 shows a process flow for manufacturing a semiconductor device, according to some embodiments of the present disclosure.

FIG. 23 shows a process flow of a pattern formation method according to an embodiment of the present disclosure. The process flow includes an operation S2301 of alkaline treatment to surface-treat a target layer (such as a metallic layer, gate electrode layer, source/drain contact layer, wiring layer, etc.) with an alkaline aqueous solution, such as a 2.38% TMAH aqueous solution. In some embodiments, the target layer is a Ti based layer, including a Ti layer, a TiN layer, a TiAl layer, a TiSi and a TiAlC layer. In other embodiments, the target layer is a Ta based layer, such as Ta layer and a TaN layer. In other embodiments, the target layer is a metal or metal alloy layer, including a W layer, a Cu layer, a AlCu layer, an Al layer, a Ni layer and a Co layer. Yet in other embodiments, the target layer is a silicide layer, including a WSi, layer, a CoSi layer, a MoSi layer, a NiSi layer and AlSi layer.

Then, the surface-treated sample undergoes an operation S2302 of heating the sample at a temperature of 100° C. or higher. Then, the sample is cooled in cooling operation S2303. During this process, the surface of the metallic layer forms a nanoscale structure improving the adhesion of the BARC layer to the metallic layer. The number of operations depends on achieving the desired surface condition without negatively affecting the metallic property of the metallic layer.

If additional alkaline treatment of the surface of the target layer is needed, the cycle can be repeated (i.e. operations S2301, S2302, S2303 are repeated) until a desired surface condition is achieved. When no more treatment is needed, i.e. 'No' in the decision box S2304, the sample is transferred to an offline coater to coat the BARC layer in some embodiments. That is, a BARC layer is coated on the sample in operation S2305, and then the sample is baked in operation S2306 and then cooled in operation S2307 to room temperature (i.e. 20-30° C.).

The sample is sequentially transferred to the track and scanner for photo resist layer pattern formation. That is, in some embodiments, ADH:HMDS priming (operation S2308) is performed, and then the sample is cooled. Then, a photo resist (PR) coating (operation S2309) is carried out to form a layer of photoresist. Soft baking followed by cooling is carried out. Next, wafer edge exposure (operation S2310) is performed in some embodiments. Scanner exposure (operation S2311) is sequentially performed, followed by a post-exposure baking, and cooling. A hard bake operation S2312 is then carried out. Then, development is performed in operation S2313, followed by cooling, resulting in a patterned photo resist layer on the BARC layer on the TMAH surface-treated layer. According to some embodiments, no treatment with hexamethyldisilazane (HMDS) is performed on the gate conductive layer. In other embodiments, operations S2301 to S2313 are performed in a single in-line lithography cluster tool.

In the above described methods, the surface treatment on a metallic layer using TMAH can form a nanoscale structure on the surface of the metallic layer, resulting in improved adhesion between the metallic layer and the BARC layer. This improves the accuracy of photolithographic patterning of semiconductor device.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

According to some the aforementioned embodiments, a method of manufacturing a semiconductor device is disclosed. In the method, a metallic layer is formed over a substrate, the metallic layer is surface-treated with an alkaline solution, and a bottom anti-reflective coating (BARC) layer is formed on the surface-treated metallic layer. In an embodiment, no oxidation process is performed on the metallic layer. In an embodiment, the alkaline solution includes tetramethylammonium hydroxide (TMAH). In an embodiment, the BARC layer includes an organic material. In an embodiment, after the BARC layer is formed, a photo resist layer is formed on the BARC layer. In an embodiment, the photo resist layer is patterned by photolithography. In an embodiment, in the method, the BARC layer is patterned by using the patterned photo resist layer as a mask. In an embodiment, the patterned photo resist layer is removed after the BARC layer is patterned. In an embodiment, the metallic layer is patterned and the patterned photo resist layer is removed after the metallic layer is patterned. In some embodiments, the metallic layer is one of a Ti layer, a TiN layer, a TiAl layer and a TiAlC layer. Also, in another embodiment, the metallic layer is one of a Ta layer, a TaN layer, a W layer, a Cu layer, an AlCu layer, an Al layer, a Ni layer and a Co layer.

According to some the aforementioned embodiments, a method of manufacturing a semiconductor device is disclosed. In an embodiment, a metallic layer is formed over at least one fin disposed on a substrate. In an embodiment, a surface of the metallic layer is converted to be hydrophilic by a wet process. In an embodiment, an organic bottom anti-reflective coating (BARC) is formed on the hydrophilic surface of the metallic layer. In an embodiment, the wet process includes treating the surface of the metallic layer with an alkaline solution. In an embodiment, the alkaline solution is an aqueous TMAH solution. In an embodiment, after the wet process, the substrate is heated at a temperature of at least 100° C. In an embodiment, after the heating, the substrate is cooled to a temperature in a range of 20 to 30° C. In an embodiment, no oxidation process is performed on the metallic layer. In an embodiment, no treatment with hexamethyldisilazane (HMDS) is performed on the metallic layer.

According to some the aforementioned embodiments, a pattern forming method is disclosed. In an embodiment, in the method, a metallic layer is formed over a substrate, a surface of the metallic layer is treated with an alkaline solution, an organic bottom anti-reflective coating layer (BARC) is formed on the surface treated metallic layer, a photo resist layer is formed on the BARC layer, the photo resist layer is exposed with an exposure energy beam via a photo mask, and the photo resist layer is exposed. In an embodiment, before forming the photo resist layer, hexamethyldisilazane (HMDS) is applied to a surface of the BARC layer. In an embodiment, the treating the surface with the alkaline solution and the forming the BARC layer are performed in a first apparatus, and the applying the HMDS and the forming the photo resist layer are performed in a second apparatus different from the first apparatus.

What is claimed is:

1. A method of manufacturing a semiconductor device, comprising:
   forming a metallic layer over a substrate;
   surface treating the metallic layer with an alkaline solution; and
   forming a bottom anti-reflective coating (BARC) layer on the surface-treated metallic layer.

2. The method of claim 1, wherein after the BARC layer is formed, forming a photo resist layer on the BARC layer.

3. The method of claim 2, wherein the photo resist layer is patterned by photolithography.

4. The method of claim 3, further comprising patterning the BARC layer by using the patterned photo resist layer as a mask.

5. The method of claim 4, wherein the patterned photo resist layer is removed after the BARC layer is patterned.

6. The method of claim 4, further comprising patterning the metallic layer; and removing the patterned photo resist layer after the metallic layer is patterned.

7. The method of claim 1, wherein no oxidation process is performed on the metallic layer.

8. The method of claim 1, wherein the alkaline solution includes tetramethylammonium hydroxide (TMAH).

9. The method of claim 1, wherein the BARC layer includes an organic material.

10. The method of claim 1, wherein the metallic layer is one of a Ti layer, a TiN layer, a TiAl layer and a TiAlC layer.

11. The method of claim 1, wherein the metallic layer is one of a Ta layer, a TaN layer, a W layer, a Cu layer, an AlCu layer, an Al layer, a Ni layer and a Co layer.

12. A method of manufacturing a semiconductor device, comprising:
    forming a metallic layer over at least one fin disposed on a substrate;
    converting a surface of the metallic layer to be hydrophilic by a wet process; and
    forming an organic bottom anti-reflective coating (BARC) on the hydrophilic surface of the metallic layer.

13. The method of claim 12, wherein the wet process includes treating the surface of the metallic layer with an alkaline solution.

14. The method of claim 13, wherein the alkaline solution is an aqueous TMAH solution.

15. The method of claim 13, further comprising, after the wet process, heating the substrate at a temperature of at least 100° C.

16. The method of claim 15, wherein after the heating, the substrate is cooled to a temperature in a range of 20 to 30° C.

17. The method of claim 12, wherein no oxidation process is performed on the metallic layer.

18. A pattern forming method, comprising:
    forming a metallic layer over a substrate;
    treating a surface of the metallic layer with an alkaline solution;
    forming an organic bottom anti-reflective coating layer (BARC) on the surface treated metallic layer;
    forming a photo resist layer on the BARC layer;
    exposing the photo resist layer with an exposure energy beam via a photo mask; and
    developing the exposed photo resist.

19. The method of claim 18, further comprising, before forming the photo resist layer, applying hexamethyldisilazane (HMDS) to a surface of the BARC layer.

20. The method of claim 19, wherein the treating the surface with the alkaline solution and the forming the BARC layer are performed in a first apparatus, and the applying the HMDS and the forming the photo resist layer are performed in a second apparatus different from the first apparatus.

* * * * *